United States Patent
Sakatsume et al.

(10) Patent No.: US 12,247,285 B2
(45) Date of Patent: Mar. 11, 2025

(54) FILM-FORMING METHOD AND RAW MATERIAL SOLUTION

(71) Applicant: SHIN-ETSU CHEMICAL CO, LTD., Tokyo (JP)

(72) Inventors: Takahiro Sakatsume, Takasaki (JP); Takenori Watabe, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 18/020,462

(22) PCT Filed: Aug. 3, 2021

(86) PCT No.: PCT/JP2021/028711
§ 371 (c)(1),
(2) Date: Feb. 9, 2023

(87) PCT Pub. No.: WO2022/039017
PCT Pub. Date: Feb. 24, 2022

(65) Prior Publication Data
US 2023/0313369 A1      Oct. 5, 2023

(30) Foreign Application Priority Data

Aug. 20, 2020   (JP) .................................. 2020-139445

(51) Int. Cl.
*C23C 16/44*        (2006.01)
*C09D 1/00*         (2006.01)
(Continued)

(52) U.S. Cl.
CPC .............. *C23C 16/448* (2013.01); *C09D 1/00* (2013.01); *C23C 16/40* (2013.01); *C23C 16/46* (2013.01)

(58) Field of Classification Search
CPC .................................................... C23C 16/455
See application file for complete search history.

(56) References Cited

U.S. PATENT DOCUMENTS 3,075,901 A * 1/1963 Hutter ..................... C22B 58/00
                                                                75/710
3,897,317 A * 7/1975 Bawa ...................... C22B 41/00
                                                                205/564

(Continued)

FOREIGN PATENT DOCUMENTS

| EP | 2 865 789 A1 | 4/2015 | |
|---|---|---|---|
| EP | 2942803 A1 * | 11/2015 | ............. C23C 16/40 |

(Continued)

OTHER PUBLICATIONS

Akaiwa et al. Electrical Conductive Corundum-Structured α-Ga2O3 Thin Films on Sapphire with Tin-Doping Grown by Spray-Assisted Mist Chemical Vapor Deposition. Japanese Journal of Applied Physics 51 (2012) (Year: 2012).*

(Continued)

*Primary Examiner* — Cachet I Proctor
(74) *Attorney, Agent, or Firm* — Oliff PLC

(57) ABSTRACT

A film-forming method in which film-formation is performed by heat-treating a mist of a raw material solution, the method including: dissolving metal gallium in an acidic solution containing at least one of hydrobromic acid and hydroiodic acid to prepare the raw material solution having a concentration of a metal impurity of less than 2%; and atomizing the raw material solution into a mist, and performing film-forming. This method can provide a film-forming method that can form a film having good crystallinity at a high film-forming rate.

5 Claims, 2 Drawing Sheets

(51) Int. Cl.
*C23C 16/40* (2006.01)
*C23C 16/448* (2006.01)
*C23C 16/46* (2006.01)

(56) References Cited

U.S. PATENT DOCUMENTS

| | | | | |
|---|---|---|---|---|
| 4,362,560 | A | * | 12/1982 | Abrjutin ................. C22B 58/00 75/688 |
| 5,102,512 | A | * | 4/1992 | Lamerant ............ B01J 20/3248 423/112 |
| 2006/0214161 | A1 | | 9/2006 | Yanagihara et al. |
| 2015/0225843 | A1 | | 8/2015 | Oda et al. |
| 2019/0259610 | A1 | * | 8/2019 | Nagaoka ........... H01L 21/02598 |
| 2020/0098818 | A1 | | 3/2020 | Ebiko |
| 2020/0194256 | A1 | | 6/2020 | Nagaoka et al. |
| 2020/0211919 | A1 | | 7/2020 | Takahashi et al. |

FOREIGN PATENT DOCUMENTS

| | | | |
|---|---|---|---|
| JP | H01-257337 A | | 10/1989 |
| JP | 2005-307238 A | | 11/2005 |
| JP | 2006-265165 A | | 10/2006 |
| JP | 2012-046772 A | | 3/2012 |
| JP | 2014-063973 A | | 4/2014 |
| JP | 2014-234337 A | | 12/2014 |
| JP | 2014-234344 A | | 12/2014 |
| JP | 2016-155714 A | | 9/2016 |
| JP | 2018070422 A | * | 5/2018 |
| JP | 2020-098818 A | | 6/2020 |
| JP | 2020-107636 A | | 7/2020 |

OTHER PUBLICATIONS

Feb. 16, 2023 International Preliminary Report on Patentability in International Patent Application No. PCT/JP2021/028711.
Oct. 5, 2021 Search Report issued in International Patent Application No. PCT/JP2021/028711.
Sep. 3, 2024 Office Action issued in Japanese Patent Application No. 2022-543359.
Jul. 18, 2024 Extended European Search Report issued in European Patent Application No. 21858165.0.
Oda, Masaya et al. "Schottky Barrier Diodes of Corundum-Structured Gallium Oxide Showing On-Resistance of 0.1 mΩ.cm2 MIST EPOTAXY®", Applied Physics Express, vol. 9, No. 2, Jan. 2016, pp. 021101-1 to 021101-3.
Web archive of "Gallium Bromide", American Elements, https://www.americanelements.com/gallium-bromide-13450-88-9 (archived Apr. 19, 2016).
Mar. 26, 2024 Office Action issued in Japanese Patent Application No. 2022-175183, with partial translation.
Oct. 31, 2024 Office Action and Search Report issued in Chinese Patent Application No. 202180055292.7.

* cited by examiner

[FIG. 1]
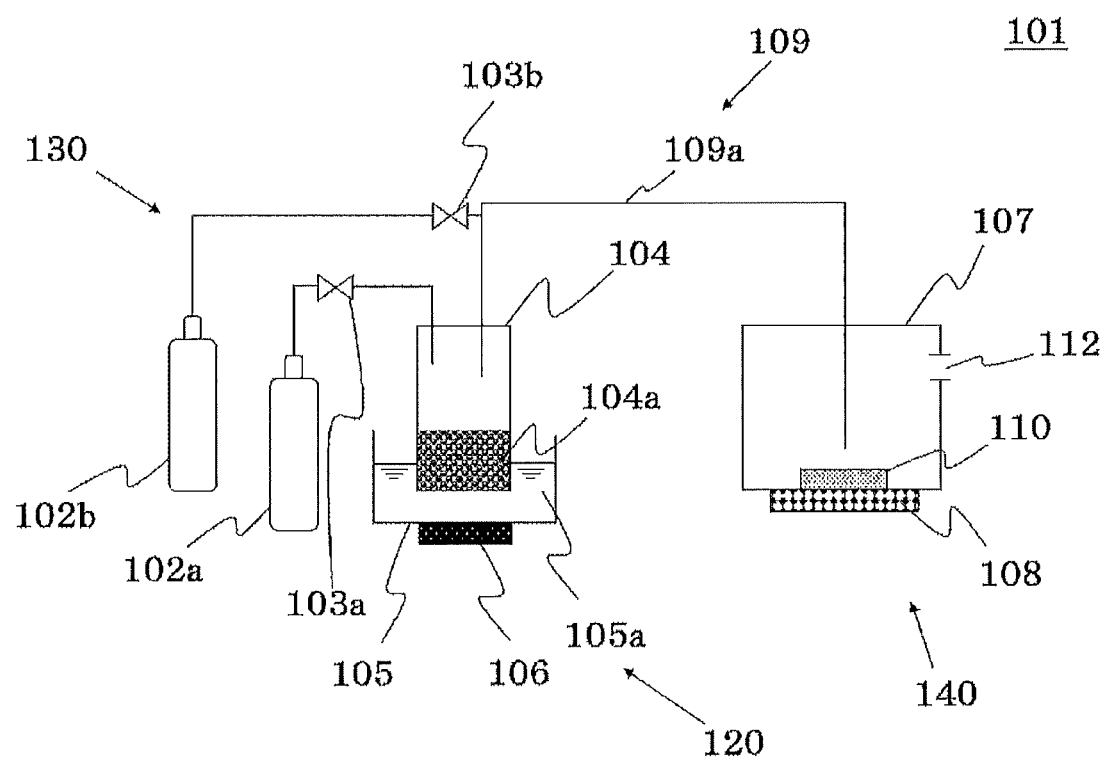

[FIG. 2]
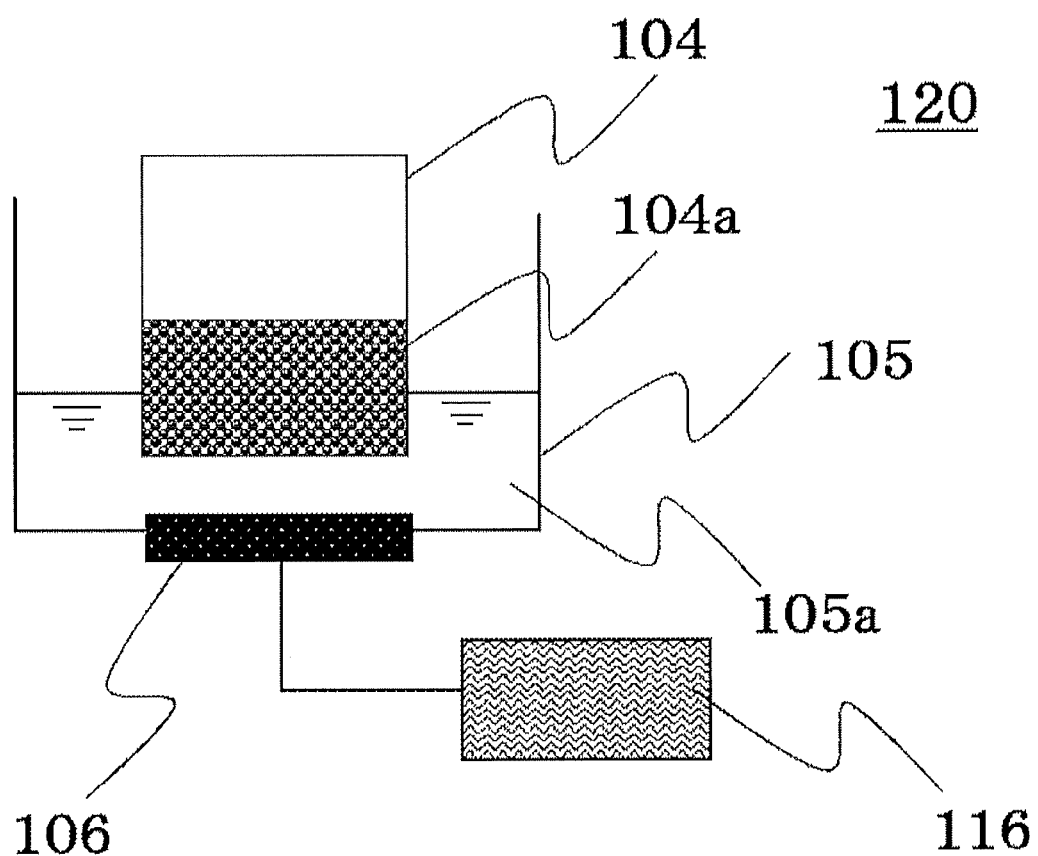

FILM-FORMING METHOD AND RAW MATERIAL SOLUTION

TECHNICAL FIELD

The present invention relates to a film-forming method in which film-formation is performed by heat-treating a mist of a raw material solution, and a raw material solution used in this film-forming method.

BACKGROUND ART

Conventionally developed vacuum film-forming apparatuses that can achieve a non-equilibrium state, such as pulsed laser deposition (PLD), molecular beam epitaxy (MBE), and sputtering, have enabled to produce an oxide semiconductor, which cannot be produced by a conventional melting method, etc. A mist chemical vapor deposition (hereinafter, also referred to as "mist CVD") in which an atomized raw material mist is used for growing a crystal on a substrate, has been developed. The mist CVD have enabled to produce gallium oxide having a corundum structure ($\alpha$-$Ga_2O_3$). The $\alpha$-$Ga_2O_3$ is promising as a semiconductor having a large band gap and application for a next-generation switching device that can achieve high pressure resistance, low loss, and high heat resistance.

About the mist CVD, Patent Document 1 describes a tubular furnace-type mist CVD apparatus. Patent Document 2 describes a fine channel-type mist CVD apparatus. Patent Document 3 describes a linear source-type mist CVD apparatus. Patent Document 4 describes a tubular furnace mist CVD apparatus. The mist CVD apparatus described in Patent Document 4 differs from the mist CVD apparatus described in Patent Document 1 in terms of introduction of a carrier gas into a mist generator. Patent Document 5 describes a mist CVD apparatus in which a substrate is provided above a mist generator and a susceptor is a rotary stage provided on a hot plate.

CITATION LIST

Patent Literature

Patent Document 1: JP H1-257337 A
Patent Document 2: JP 2005-307238 A
Patent Document 3: JP 2012-46772 A
Patent Document 4: JP 2014-234337 A
Patent Document 5: JP 2014-63973 A

SUMMARY OF INVENTION

Technical Problem

The mist CVD method can form a film at a relatively low temperature, differing from other CVD methods, and can also produce a crystal structure with a metastable phase, such as an $\alpha$-$Ga_2O_3$ corundum structure. However, the present inventors have found a problem that a metal impurity contained in a raw material solution at a larger concentration increases impurities in the film to decrease crystallinity and a film-forming rate.

The present invention has been made to solve above-described problem. An object of the present invention is to provide: a film-forming method that can form a film having good crystallinity at a high film-forming rate; and a raw material solution used in this film-forming method.

Solution to Problem

To solve the above problem, the present invention provides a film-forming method in which film-formation is performed by heat-treating a mist of a raw material solution, the method comprising:

dissolving metal gallium in an acidic solution containing at least one of hydrobromic acid and hydroiodic acid to prepare the raw material solution having a concentration of a metal impurity of less than 2%; and atomizing the raw material solution into a mist, and performing film-forming.

Such a film-forming method reduces an amount of a metal impurity in the raw material solution to be atomized into mist, and consequently, a film having few impurity amount and good crystallinity can be formed at a high film-forming rate.

In this time, the raw material solution may contain, as the metal impurity, at least one metal element selected from the group consisting of aluminum, cobalt, chromium, copper, iron, manganese, nickel, titanium, vanadium, zirconium, magnesium, zinc, indium, lead, barium, cadmium, strontium, calcium, antimony, sodium, and potassium.

Even when the prepared raw material solution contains the above metal elements, preparing the raw material solution with a content of the metal impurity of less than 2% by dissolving metal gallium in the acidic solution containing at least one of hydrobromic acid and hydroiodic acid and using this raw material solution can form a film having few amount of a metal impurity and good crystallinity at a high film-forming rate.

In this time, the raw material solution having a content of the metal impurity of less than 0.5% or less is preferably used.

This use of the raw material solution can form a film having better crystallinity.

Alternatively, preferably used as the raw material solution is the raw material solution having a magnesium concentration of 0.5% or less, a cobalt concentration of 0.5% or less, a chromium concentration of 0.5% or less, an iron concentration of 1.5% or less, a manganese concentration of 0.4% or less, a nickel concentration of 0.3% or less, a titanium concentration of 0.1% or less, a vanadium concentration of 0.2% or less, a zirconium concentration of 0.1% or less, a barium concentration of 0.5% or less, a calcium concentration of 0.5% or less, a strontium concentration of 0.5% or less, a zinc concentration of 0.9% or less, an indium concentration of 0.5% or less, a lead concentration of 1.7% or less, an antimony concentration of 1.5% or less, an aluminum concentration of 0.2% or less, a sodium concentration of 1.7% or less, a potassium concentration of 1.4% or less, a copper concentration of 0.5% or less, a cadmium concentration of 0.5% or less, and a total concentration of the metal impurity of less than 2%.

When each content of magnesium, cobalt, chromium, iron, manganese, nickel, barium, calcium, strontium, zinc, lead, antimony, sodium, potassium, and cadmium, as the metal impurity, is the above concentration or less, films such as a gallium oxide film can be formed at a higher film-forming rate. When a concentration of indium, as the metal impurity, is the above concentration or less, a film having better crystallinity can be formed. When each content of titanium, vanadium, zirconium, copper, and aluminum, as the metal impurity, is the above concentration or less, a film having better crystallinity can be formed at a higher film-forming rate.

The present invention also provides a film-forming method in which film-formation is performed by heat-treating a mist of a raw material solution, the method comprising:
dissolving a gallium compound having a purity of 99.9% or more in a solvent containing at least water to prepare a raw material solution; and
atomizing the raw material solution into a mist, and performing film-forming.

Such a film-forming method reduces the metal impurity amount in the raw material solution to be atomized into mist, and consequently, a film having few impurity amount and good crystallinity can be formed at a high film-forming rate.

In this time, a gallium halide is preferably used as the gallium compound.

The use of the gallium halide can form a film having better crystallinity at a high film-forming rate.

The present invention also provides a raw material solution used in a film-forming method in which film-formation is performed by heat-treating a mist of a raw material solution, the raw material solution comprising:
an acidic solution containing at least one of hydrobromic acid and hydroiodic acid; and
a gallium ion,
wherein
the raw material solution has a concentration of a metal impurity of less than 2%,
the metal impurity is at least one metal element selected from the group consisting of aluminum, cobalt, chromium, copper, iron, manganese, nickel, titanium, vanadium, zirconium, magnesium, zinc, indium, lead, barium, cadmium, strontium, calcium, antimony, sodium, and potassium, and
the raw material solution has a magnesium concentration of 0.5% or less, a cobalt concentration of 0.5% or less, a chromium concentration of 0.5% or less, an iron concentration of 1.5% or less, a manganese concentration of 0.4% or less, a nickel concentration of 0.3% or less, a titanium concentration of 0.1% or less, a vanadium concentration of 0.2% or less, a zirconium concentration of 0.1% or less, a barium concentration of 0.5% or less, a calcium concentration of 0.5% or less, a strontium concentration of 0.5% or less, a zinc concentration of 0.9% or less, an indium concentration of 0.5% or less, a lead concentration of 1.7% or less, an antimony concentration of 1.5% or less, an aluminum concentration of 0.2% or less, a sodium concentration of 1.7% or less, a potassium concentration of 1.4% or less, a copper concentration of 0.5% or less, and a cadmium concentration of 0.5% or less.

Film formation using such a raw material solution can form a film having few impurity amount and good crystallinity at a high film-forming rate.

Advantageous Effects of Invention

As above, according to the inventive film-forming method, a film having few impurity amount and good crystallinity can be formed at a high film-forming rate.

Using the inventive raw material solution can form a film having few impurity amount and good crystallinity at a high film-forming rate.

BRIEF DESCRIPTION OF DRAWINGS

FIG. 1 is a schematic diagram illustrating an example of a film-forming apparatus that can perform the inventive film-forming method.

FIG. 2 is a schematic view describing an example of a mist-forming part that can be comprise in the film-forming apparatus that can perform the inventive film-forming method.

DESCRIPTION OF EMBODIMENTS

As described above, there have been demands for a film-forming method that can form a film having good crystallinity by a mist CVD method at a high film-forming rate.

The present inventors have earnestly studied the above problem and consequently found that dissolving metal gallium in an acidic solution containing at least one of hydrobromic acid and hydroiodic acid to prepare a raw material solution with a concentration of a metal impurity of less than 2% and using this raw material solution can form a film having good crystallinity at a high film-forming rate. This finding has led to the completion of a first aspect of the present invention.

Specifically, the first aspect of the present invention is a film-forming method in which film-formation is performed by heat-treating a mist of a raw material solution, the method comprising:
dissolving metal gallium in an acidic solution containing at least one of hydrobromic acid and hydroiodic acid to prepare the raw material solution having a concentration of a metal impurity of less than 2%; and
atomizing the raw material solution into a mist, and performing film-forming.

Furthermore, the present inventors have earnestly studied the above problem and consequently also found that preparing a raw material solution by dissolving a gallium compound having a purity of 99.9% or more in a solvent containing at least water and using this raw material solution can form a film having good crystallinity at a high film-forming rate. This finding has led to the completion of a second aspect of the present invention.

Specifically, the second aspect of the present invention is a film-forming method in which film-formation is performed by heat-treating a mist of a raw material solution, the method comprising:
dissolving a gallium compound having a purity of 99.9% or more in a solvent containing at least water to prepare a raw material solution; and
atomizing the raw material solution into a mist, and performing film-forming.

Furthermore, the present inventors have earnestly studied the above problem and consequently also found that a raw material solution comprising: an acidic solution containing at least one of hydrobromic acid and hydroiodic acid; and a gallium ion, the raw material solution having a concentration of a metal impurity of less than 2% can form a film having good crystallinity at a high film-forming rate. This finding has led to the completion of a third aspect of the present invention.

Specifically, the third aspect of the present invention is a raw material solution used in a film-forming method in which film-formation is performed by heat-treating a mist of a raw material solution, the raw material solution comprising:
an acidic solution containing at least one of hydrobromic acid and hydroiodic acid; and
a gallium ion,
wherein
the raw material solution has a concentration of a metal impurity of less than 2%, the metal impurity is at least one metal element selected from the group consisting of aluminum, cobalt, chromium, copper, iron, manganese, nickel, titanium, vanadium, zirconium, magnesium, zinc, indium, lead, barium, cadmium, strontium, calcium, antimony, sodium, and potassium, and the raw material solution has a magnesium concentration of 0.5% or less, a cobalt concentration of 0.5% or less, a chromium concentration of 0.5% or less, an iron concentration of 1.5% or less, a manganese concentration of 0.4% or less, a nickel concentration of 0.3% or less, a titanium concentration of 0.1% or less, a vanadium concentration of 0.2% or less, a zirconium concentration of 0.1% or less, a barium concentration of 0.5% or less, a calcium concentration of 0.5% or less, a strontium concentration of 0.5% or less, a zinc concentration of 0.9% or less, an indium concentration of 0.5% or less, a lead concentration of 1.7% or less, an antimony concentration of 1.5% or less, an aluminum concentration of 0.2% or less, a sodium concentration of 1.7% or less, a potassium concentration of 1.4% or less, a copper concentration of 0.5% or less, and a cadmium concentration of 0.5% or less.

Hereinafter, the present invention will be described in detail, but the present invention is not limited thereto.

Should be noted that a mist described in the present invention is collectively referred to fine liquid particles dispersed in gas, and includes forms referred to as fog, droplet, etc.

[Film-Forming Apparatus]

First, an example of a film-forming apparatus that can perform the inventive film-forming method will be described with reference to FIG. 1 and FIG. 2. However, the inventive film-forming method can also be performed with an apparatus differing from the apparatus exemplified below.

FIG. 1 illustrates an example of a film-forming apparatus 101 that can perform the inventive film-forming method. The film-forming apparatus 101 includes: a mist-forming part 120 to atomize a raw material solution 104*a* into a mist to generate a mist; a carrier gas supplier part 130 to supply a carrier gas for transferring the mist; a film-forming part 140 to heat-treating the mist and forming a film on a substrate 110; and a transferring part 109 connecting the mist-forming part 120 and the film-forming part 140 to transfer the mist by the carrier gas. The film-forming apparatus 101 may include a controller (not illustrated) to control entire or a part of the film-forming apparatus 101 to control the operation.

Hereinafter, each member of the film-forming apparatus 101 will be described.

(Mist-Forming Part)

The mist-forming part 120 atomizes the raw material solution 104*a* into a mist to generate a mist. A means for forming the mist is not particularly limited as long as it can atomize the raw material solution 104*a* into a mist. Although the means for forming the mist may be a known means, a means for forming a mist with ultrasonic wave vibration is preferably used. This is because the ultrasonic wave vibration can further stably form a mist.

FIG. 2 illustrates an example of such a mist-forming part 120. The mist-forming part 120 may include: a mist generation source (raw material container) 104 containing the raw material solution 104*a*; a container 105 in which a medium that can propagate the ultrasonic wave vibration, for example water 105*a*, is to be contained; and an ultrasonic wave vibrator 106 attached to a bottom of the container 105, for example, as illustrated in FIG. 1 and FIG. 2. In detail, in the mist-forming part 120 illustrated in FIG. 1 and FIG. 2, the mist generation source 104 composed of the raw material container containing the raw material solution 104*a* is contained in the container 105 containing the water 105*a* by using a support (not illustrated). Furthermore, as illustrated in FIG. 1 and FIG. 2, the container 105 includes the ultrasonic wave vibrator 106 on the bottom thereof, and the ultrasonic wave vibrator 106 and an oscillator 116 illustrated in FIG. 2 are connected to each other. The mist-forming part 120 is configured that, when the oscillator 116 operates, the ultrasonic wave vibrator 106 vibrates to generate ultrasonic wave, and this ultrasonic wave is propagated through the water 105*a* to the raw material solution 104*a* in the mist generation source 104 to atomize the raw material solution 104*a* into the mist.

(Carrier Gas Supplier Part)

The carrier gas supplier part 130 has a carrier gas source 102*a* to supply a carrier gas, and may include a flow-rate regulating valve 103*a* for regulating a flow rate of the carrier gas fed from the carrier gas source 102*a*. The carrier gas supplier part 130 can also comprise: a dilution carrier gas source 102*b* for supplying a dilution carrier gas as necessary; and a flow-rate regulating valve 103*b* for regulating a flow rate of the dilution carrier gas fed from the dilution carrier gas source 102*b*, as illustrated in FIG. 1.

A kind of the carrier gas is not particularly limited, and can be appropriately selected depending on a film to be formed. Examples thereof include: oxygen; ozone; inert gasses, such as nitrogen and argon; and reductive gasses, such as hydrogen gas and a forming gas. A number of the kind of the carrier gas may be one, or may be two or more. For example, a diluted gas, formed by diluting a gas same as a first carrier gas with another dilution carrier gas (for example, diluted 10 times), may be further used as a second carrier gas. Air can be used.

A supplying position of the carrier gas may be provided at only one position, or may be provided at two or more positions.

The flow rate of the carrier gas is not particularly limited. When a film is formed on a substrate with 4 inch (100 nm) in diameter, for example, the flow rate is preferably 1 to 80 L/min, and more preferably 4 to 40 L/min.

A material of the member constituting the carrier gas supplier part 130 is not particularly limited, and examples thereof include glass, quartz, vinyl chloride, chlorinated polyether, an acrylic resin, a fluororesin (a perfluoroalkoxyalkane, polytetrafluoroethylene, and polychlorotrifluoroethylene), polyethylene, polypropylene, polystyrene, and a polyurethane. A fluororesin is preferably used because the fluororesin can inhibit contamination of an unintentional impurity from the member constituting the carrier gas supplier part 130 into the mist.

(Film-Forming Part)

The film-forming part 140 is configured to heat the mist to proceed a thermal reaction and form a film on a part or entirety of the surface of the substrate (crystalline substrate) 110. The film-forming part 140 includes, for example, a film-forming chamber 107. In the film-forming chamber 107, the substrate (crystalline substrate) 110 can be provided, and the film-forming chamber 107 can include a hot plate 108 for heating the substrate (crystalline substrate) 110. The hot plate 108 may be provided outside the film-forming chamber 107, as illustrated in FIG. 1, or may be provided inside the film-forming chamber 107. On the film-forming chamber 107, a ventilation port 112 for exhaust gas may be provided at a position not affecting the supply of the mist to the substrate (crystalline substrate) 110.

The substrate (crystalline substrate) 110 may be provided on an upper face of the film-forming chamber 107 to be face-down. The substrate (crystalline substrate) 110 may be provided on a bottom face of the film-forming chamber 107 to be face-up.

A material of the member constituting the film-forming part 140 is not particularly limited, and examples thereof include: metals such as iron, aluminum, stainless steel, and gold; quartz; and boron nitride. The material is preferably quartz or boron nitride because such a material can inhibit contamination of an unintentional impurity from the member constituting the film-forming part 140 into the mist.

When metals such as iron, aluminum, stainless steel, and gold are used, a part to be exposed to the mist is preferably coated with boron nitride, etc. because such a coating can inhibit contamination of an unintentional impurity from the member constituting the film-forming part 140 into the mist.

(Transferring Part)

The transferring part 109 connects the mist-forming part 120 and the film-forming part 140. Through the transferring part 109, the mist is transferred from the mist generation source 104 in the mist-forming part 120 to the film-forming chamber 107 in the film-forming part 140 with the carrier gas. The transferring part 109 can be, for example, a supplying pipe 109a. As the supplying pipe 109a, a quartz pipe, a tube made of a resin, etc. can be used, for example.

(Substrate)

The substrate 110 is not particularly limited as long as the film can be formed thereon and the substrate can support the film. A material of the substrate 110 is also not particularly limited, and known substrates can be used. The material may be an organic compound, or may be an inorganic compound. Examples thereof include a polysulfone, a polyether sulfone, a polyphenylene sulfide, a polyether ether ketone, a polyimide, a polyether imide, a fluororesin, metals such as iron, aluminum, stainless steel, and gold, silicon, sapphire, quartz, glass, gallium oxide, and lithium tantalate, but the material is not limited thereto. A thickness of the substrate is not particularly limited, but preferably 10 to 2000 μm, more preferably 50 to 800 μm. An area of the substrate 110 is not particularly limited, but favorably 10 cm² or more, or 2 inch (approximately 50.8 mm) or more in diameter. This is because the present invention can form the film on a large area at a high film-forming rate.

[Film-Forming Method]

Next, the inventive film-forming method will be described.

[First Aspect]

As described above, the film-forming method of the first aspect of the present invention includes: dissolving metal gallium in an acidic solution containing at least one of hydrobromic acid and hydroiodic acid to prepare a raw material solution having a concentration of a metal impurity less than 2%; and atomizing the raw material solution into a mist, and performing film-forming.

Such a film-forming method of the first aspect reduces the amount of the metal impurity in the raw material solution to be atomized into the mist. As a result, a film having few impurity amount and good crystallinity can be formed at a high film-forming rate.

Meanwhile, if the preparation of a raw material solution by using metal gallium is not performed according to the above procedure and, instead, a raw material solution is prepared by, for example, dissolving gallium iodide or gallium bromide with a purity of less than 99.9% in water, the obtained raw material solution excessively contains an inevitable metal impurity. A film formed by using such a raw material solution exhibit poor crystallinity.

Examples of the metal impurity include at least one metal element selected from the group consisting of aluminum, cobalt, chromium, copper, iron, manganese, nickel, titanium, vanadium, zirconium, magnesium, zinc, indium, lead, barium, cadmium, strontium, calcium, antimony, sodium, and potassium. According to the inventive film-forming method, even when the raw material solution to be used contains these metal elements at an amount of less than 2%, a film having few impurity amount and good crystallinity can be formed at a high film-forming rate.

A concentration of the metal impurity being at least one metal element selected from the group consisting of aluminum, cobalt, chromium, copper, iron, manganese, nickel, titanium, vanadium, zirconium, magnesium, zinc, indium, lead, barium, cadmium, strontium, calcium, antimony, sodium, and potassium in the raw material solution to be used is preferably less than 0.5%, and more preferably less than 500 ppm (0.05%). This is because the film crystallinity is further improved.

In another aspect, preferably used as the raw material solution is a raw material solution having a magnesium concentration of 0.5% or less, a cobalt concentration of 0.5% or less, a chromium concentration of 0.5% or less, an iron concentration of 1.5% or less, a manganese concentration of 0.4% or less, a nickel concentration of 0.3% or less, a titanium concentration of 0.1% or less, a vanadium concentration of 0.2% or less, a zirconium concentration of 0.1% or less, a barium concentration of 0.5% or less, a calcium concentration of 0.5% or less, a strontium concentration of 0.5% or less, a zinc concentration of 0.9% or less, an indium concentration of 0.5% or less, a lead concentration of 1.7% or less, an antimony concentration of 1.5% or less, an aluminum concentration of 0.2% or less, a sodium concentration of 1.7% or less, a potassium concentration of 1.4% or less, a copper concentration of 0.5% or less, a cadmium concentration of 0.5% or less, and a total concentration of the metal impurity of less than 2%.

When each concentration of magnesium, cobalt, chromium, iron, manganese, nickel, barium, calcium, strontium, zinc, lead, antimony, sodium, potassium, and cadmium, as the metal impurity, is the above concentration or less, films such as a gallium oxide film can be formed at a higher film-forming rate, for example. When a concentration of indium, as the metal impurity, is the above concentration or less, a film having better crystallinity can be formed. When each concentration of titanium, vanadium, zirconium, copper, and aluminum, as the metal impurity, is the above concentration or less, a film having better crystallinity can be formed at a higher film-forming rate.

A lower limit of the concentration of the metal impurity (total concentration of the metal impurity) in the raw material solution is not particularly limited, and a lower concentration is more preferable. The concentration of the metal impurity can be practically, for example, $1\times10^{-5}\%$ or more.

A method for measuring the impurity amount is not particularly limited, and it may be any method as long as it can analyze the above metal elements. Inductively coupled plasma (ICP) emission spectroscopy is preferably used because it can measure many elements in one measurement, and the measurement time can be shortened to inhibit contamination of impurity during the measurement.

The acidic solution used for preparing the raw material solution may further contain hydrochloric acid in addition to the at least one of hydrobromic acid and hydroiodic acid. A solute concentration is preferably 0.01 to 1 mol/L.

A temperature when the metal gallium is added to be dissolved in the at least one of hydrobromic acid and hydroiodic acid is 0° C. or higher and 100° C. or lower, preferably 25° C. or higher, and further preferably 45° C. or higher. This is because such a temperature can shorten a time required for dissolving the raw material to inhibit contamination of impurity from the outside and unintentional oxidation of the raw material solution during the dissolution.

A time when the metal gallium is added to be dissolved in the at least one of hydrobromic acid and hydroiodic acid is any as long as it can dissolve metal gallium. When a 0.01 M gallium solution is prepared, the time is preferably 30 minutes or longer, preferably 60 minutes or longer and 720 minutes or shorter, and more preferably 120 minutes or longer and 360 minutes or shorter. The dissolution for the preferable time can prevent presence of undissolved fine gallium in the raw material solution, contamination of impurity from the outside, and unintentional oxidation of the raw material solution during the dissolution.

When the metal gallium is added to be dissolved in the at least one of hydrobromic acid and hydroiodic acid, ultrasonic wave irradiation and stirring with a stirrer are preferably used to promote the dissolution. This is because such promotion can shorten the time required for dissolving the raw material to inhibit contamination of impurity from the outside and unintentional oxidation of the raw material solution during the dissolution.

With the raw material solution, additives such as an oxidant may be mixed. Examples of the oxidant include: peroxides, such as hydrogen peroxide ($H_2O_2$), sodium peroxide ($Na_2O_2$), barium peroxide ($BaO_2$), and benzoyl peroxide (($C_6H_5CO)_2O_2$); hypochlorous acid (HClO); perchloric acid; nitric acid; ozonated water; and organic peroxides, such as peracetic acid and nitrobenzene.

The raw material solution to be used may further contain a dopant. The dopant is not particularly limited. Examples thereof include: n-type dopants, such as tin, germanium, silicon, and niobium; and p-type dopants, such as silver, tin, iridium, and rhodium. A concentration of the dopant may be, for example, approximately $1 \times 10^{16}$ atom/cm$^3$ to $1 \times 10^{22}$ atom/cm$^3$, may be a low concentration of equal to or lower than approximately $1 \times 10^{17}$ atom/cm$^3$, or may be a high concentration of equal to or higher than approximately $1 \times 10^{20}$ atom/cm$^3$.

The heat treatment may be performed so that the raw material solution atomized into a mist is reacted by heating. The reaction condition, etc. are not particularly limited, and appropriately set depending on the raw material and the film to be formed. For example, the heating temperature may be within a range of 120 to 600° C., preferably within a range of 200° C. to 600° C., and more preferably within a range of 300° C. to 550° C.

The heat treatment may be performed under any condition of, vacuum, a non-oxygen atmosphere, a reductive gas atmosphere, an air atmosphere, and an oxygen atmosphere, and is appropriately selected depending on a film to be formed. The heat treatment may be performed under any reaction pressure of, the atmospheric pressure, pressurized, and reduced pressure, but a film is preferably formed under the atmospheric pressure because the apparatus constitution can be simplified.

The film may be formed directly on the substrate, or may be formed on an intermediate layer formed on the substrate to obtain a stacked product. The intermediate layer is not particularly limited, but preferably has a crystalline structure similar to that of the film to be formed by the inventive film-forming method. For example, the intermediate layer may be a metal oxide that can have a corundum structure. In such a case, an oxide containing any one of aluminum, titanium, vanadium, chromium, iron, gallium, rhodium, indium, and iridium can be a main component, for example. More specifically, the oxide may be: $Al_2O_3$, $Ti_2O_3$, $V_2O_3$, $Cr_2O_3$, $Fe_2O_3$, $Ga_2O_3$, $Rh_2O_3$, $In_2O_3$, or $Ir_2O_3$; a binary metal oxide represented by $(A_xB_{1-x})_2O_3$ ($0<x<1$), wherein A and B represent two elements selected from the above metal elements; or a trinary metal oxide represented by $(Al_xB_yC_{1-x-y})_2O_3$ ($0<x<1$ and $0<y<1$), wherein A, B, and C represent three elements selected from the above metal elements.

In the present invention, an annealing treatment may be performed after the film formation. A temperature of the annealing treatment is not particularly limited, but preferably 600° C. or lower, and more preferably 550° C. or lower. This is because such a temperature does not impair the film crystallinity. The time of the annealing treatment is not particularly limited, but preferably 10 seconds to 10 hours, and more preferably 10 seconds to 1 hour.

[Second Aspect]

As described above, the film-forming method of the second aspect of the present invention is a film-forming method in which film-formation is performed by heat-treating a mist of a raw material solution, the method including: dissolving a gallium compound having a purity of 99.9% or more in a solvent containing at least water to prepare a raw material solution; and atomizing the raw material solution into a mist, and performing film-forming.

Such a film-forming method of the second aspect reduces the amount of the metal impurity in the raw material solution to be atomized into the mist. As a result, a film having few impurity amount and good crystallinity can be formed at a high film-forming rate.

The gallium compound may be any as long as it can be dissolved in the solvent containing at least water. Examples thereof include an acetylacetonate complex, a carbonyl complex, an ammine complex, a hydride complex, gallium chloride, gallium bromide, and gallium iodide, but a gallium halide (a halide of gallium) is preferably used. This is because the gallium halide can form a film having higher crystallinity at a higher film-forming rate than a complex. A solute concentration is preferably 0.01 to 1 mol/L.

An upper limit of the purity of the gallium compound is not particularly limited, and a higher purity is more preferable. The purity of the gallium compound can be practically, for example, 99.99999% or lower.

With the raw material solution, additives such as a halogen-containing compound (for example, hydrohalogenic acid) and an oxidant may be mixed. Examples of the hydrohalogenic acid include hydrobromic acid, hydrochloric acid, and hydroiodic acid. Among them, hydrobromic acid or hydroiodic acid is preferable. Examples of the oxidant include: peroxides, such as hydrogen peroxide ($H_2O_2$), sodium peroxide ($Na_2O_2$), barium peroxide ($BaO_2$), and benzoyl peroxide (($C_6H_5CO)_2O_2$); hypochlorous acid (HClO); perchloric acid; nitric acid; ozonated water; and organic peroxides, such as peracetic acid and nitrobenzene.

A temperature when the gallium compound is added to be dissolved in the solvent containing at least water may be 0° C. or higher and 100° C. or lower, preferably 25° C. or higher, and further preferably 45° C. or higher. This is because such a temperature can shorten a time required for dissolving the raw material to inhibit contamination of impurity from the outside and unintentional oxidation of the raw material solution during the dissolution.

A time when the gallium compound is added to be dissolved in the solvent containing at least water is not particularly limited. When a 0.01 M gallium solution is prepared, the time is preferably 20 minutes or longer, preferably 30 minutes or longer and 720 minutes or shorter, and more preferably 60 minutes or longer and 360 minutes or shorter. The dissolution for the preferable time can prevent presence of undissolved fine gallium compound in the raw material solution, contamination of impurity from the outside, and unintentional oxidation of the raw material solution during the dissolution.

When the gallium compound is added to be dissolved in the solvent containing at least water, ultrasonic wave irradiation and stirring with a stirrer are preferably used to promote the dissolution. This is because such promotion can shorten the time required for dissolving the raw material to inhibit contamination of impurity from the outside and unintentional oxidation of the raw material solution.

The purity of the gallium compound may be a purity according to a specification of its reagent manufacturer, or may be calculated by independent analysis. When the independent analysis is performed, a method for measuring the impurity amount of the gallium compound is not particularly limited. For example, the method is any as long as it can analyze the metal elements listed in the description of the first aspect. A solution of the gallium compound dissolved in a solvent may be analyzed by ICP, etc., or the solid sample may be analyzed by glow discharge mass spectrometry (GDMS), etc. The specification of the reagent manufacturer may be referred. However, a measurement error may occur due to contamination of impurity during preparation of the measurement sample and due to the measurement apparatus, and therefore, the independent analysis is preferable in terms of relative comparability of the impurity amounts in each reagent in the case where reagents from a plurality of reagent manufacturers are used.

The raw material solution used for the film-forming method of the second aspect may also contain a dopant, similar to the description of the film-forming method of the first aspect. For detail of the dopant, should be noted the description of the first aspect.

A heat treatment of the raw material solution in the film-forming method of the second aspect is not particularly limited, and can be similar to the heat treatment of the first aspect, for example.

Also, in the film-forming method of the second aspect, the film may be formed directly on the substrate, or may be formed on an intermediate layer formed on the substrate to obtain a stacked product. The intermediate layer is not particularly limited, and an intermediate layer similar to the intermediate layer described in the first aspect can be used, for example.

Also, in the film-forming method of the second aspect, an annealing treatment similar to the annealing treatment that can be performed in the film-forming method of the first aspect can be performed after the film formation.

[Raw Material Solution]

In the film-forming methods of the first aspect and the second aspect, for example, a raw material solution including: an acidic solution containing at least one of hydrobromic acid and hydroiodic acid; and a gallium ion, wherein the raw material solution has a concentration of a metal impurity of less than 2% can be prepared. In particular, a raw material solution having a magnesium concentration of 0.5% or less, a cobalt concentration of 0.5% or less, a chromium concentration of 0.5% or less, an iron concentration of 1.5% or less, a manganese concentration of 0.4% or less, a nickel concentration of 0.3% or less, a titanium concentration of 0.1% or less, a vanadium concentration of 0.2% or less, a zirconium concentration of 0.1% or less, a barium concentration of 0.5% or less, a calcium concentration of 0.5% or less, a strontium concentration of 0.5% or less, a zinc concentration of 0.9% or less, an indium concentration of 0.5% or less, a lead concentration of 1.7% or less, an antimony concentration of 1.5% or less, an aluminum concentration of 0.2% or less, a sodium concentration of 1.7% or less, a potassium concentration of 1.4% or less, a copper concentration of 0.5% or less, and a cadmium concentration of 0.5% or less can be prepared.

By atomizing such a raw material solution into a mist, heat-treating the mist of the raw material solution, and performing film-forming, a film having few impurity amount and good crystallinity can be formed at a high film-forming rate, as described above.

EXAMPLES

Hereinafter, the present invention will be specifically described by using Examples and Comparative Examples, but the present invention is not limited thereto.

Example 1

In Example 1, the film-forming apparatus 101 described with reference to FIG. 1 was used to perform film-forming, according to the following procedure.

Metal gallium (purity of 99.99%) was dissolved in a hydroiodic acid solution to prepare a 0.05 mol/L aqueous gallium solution. This aqueous gallium solution was used as a raw material solution 104a. The raw material solution 104a obtained as above was contained in a mist generation source 104. A temperature of the solution in this time was 25° C. Then, a 4-inch c-face sapphire substrate 110 (100 mm in diameter) as a substrate 110 was mounted on a hot plate 108 in a film-forming chamber 107, and the hot plate 108 was operated to rise the temperature to 500° C.

Subsequently, a flow-rate regulating valve 103a was opened to supply nitrogen gas as a carrier gas from a carrier gas source 102a into the film-forming chamber 107 to sufficiently substitute an atmosphere in the film-forming chamber 107 with the carrier gas. In addition, the flow-rate regulating valve 103b was further opened to supply nitrogen gas as a dilution carrier gas from a carrier gas source 102b into the film-forming chamber 107. A flow rate of the main carrier gas was regulated to 5 L/min, and a flow rate of the dilution carrier gas was regulated to 5 L/min.

Then, an ultrasonic wave vibrator 106 was vibrated at 2.4 MHz, and the vibration was propagated through water 105a to the raw material solution 104a to atomize the raw material solution 104a into a mist to generate a mist. This mist was introduced into the film-forming chamber 107 through a supplying pipe 109a with the carrier gas. Then, the mist was heat-treated in the film-forming chamber 107 under a condition of the atmospheric pressure at 500° C. to proceed the thermal reaction to form a thin film of gallium oxide ($\alpha$-$Ga_2O_3$) having a corundum structure on the substrate 110. The film-forming time was 60 minutes.

Comparative Example 1

A film was formed in the same manner as in Example 1 except that gallium iodide (purity of 98%) was dissolved in water to prepare a 0.05 mol/L aqueous gallium solution and this aqueous gallium solution was used as the raw material solution.

Comparative Example 2

A film was formed in the same manner as in Example 1 except that gallium bromide (purity of 98%) was dissolved in water to prepare a 0.05 mol/L aqueous gallium solution and this aqueous gallium solution was used as the raw material solution.

Example 2

A film was formed in the same manner as in Example 1 except that magnesium (II) chloride was added to be 0.5% in a 0.05 mol/L aqueous gallium solution prepared in the same manner as in Example 1 to prepare a raw material solution and this raw material solution was used.

Example 3

A film was formed in the same manner as in Example 1 except that magnesium (II) chloride was added to be 0.05% in a 0.05 mol/L aqueous gallium solution prepared in the same manner as in Example 1 to prepare a raw material solution and this raw material solution was used.

Example 4

A film was formed in the same manner as in Example 1 except that cobalt (II) chloride and chromium (III) chloride were added to be each 0.8% in a 0.05 mol/L aqueous gallium solution prepared in the same manner as in Example 1 to prepare a raw material solution and this raw material solution was used.

Example 5

A film was formed in the same manner as in Example 1 except that iron (II) chloride was added to be 1.5% in a 0.05 mol/L aqueous gallium solution prepared in the same manner as in Example 1 to prepare a raw material solution and this raw material solution was used.

Example 6

A film was formed in the same manner as in Example 1 except that manganese (II) chloride and nickel (II) chloride were added to be each 0.4% in a 0.05 mol/L aqueous gallium solution prepared in the same manner as in Example 1 to prepare a raw material solution and this raw material solution was used.

Example 7

A film was formed in the same manner as in Example 1 except that a titanium (IV) acetylacetonate complex was added to be 0.1% in a 0.05 mol/L aqueous gallium solution prepared in the same manner as in Example 1 to prepare a raw material solution and this raw material solution was used.

Example 8

A film was formed in the same manner as in Example 1 except that vanadium (III) chloride was added to be 0.2% in a 0.05 mol/L aqueous gallium solution prepared in the same manner as in Example 1 to prepare a raw material solution and this raw material solution was used.

Example 9

A film was formed in the same manner as in Example 1 except that a zirconium (IV) acetylacetonate complex was added to be 0.1% in a 0.05 mol/L aqueous gallium solution prepared in the same manner as in Example 1 to prepare a raw material solution and this raw material solution was used.

Example 10

A film was formed in the same manner as in Example 1 except that: the metal gallium was dissolved in a hydrobromic acid solution to prepare a 0.05 mol/L aqueous gallium solution; and in this aqueous gallium solution, barium (II) chloride, calcium (II) chloride, and strontium (II) chloride were added to be each 0.5% to prepare a raw material solution and this raw material solution was used.

Example 11

A film was formed in the same manner as in Example 1 except that cadmium (II) chloride was added to be 0.5% in a 0.05 mol/L aqueous gallium solution prepared in the same manner as in Example 10 to prepare a raw material solution and this raw material solution was used.

Example 12

A film was formed in the same manner as in Example 1 except that zinc (II) chloride was added to be 0.8% in a 0.05 mol/L aqueous gallium solution prepared in the same manner as in Example 10 to prepare a raw material solution and this raw material solution was used.

Example 13

A film was formed in the same manner as in Example 1 except that indium (III) chloride was added to be 0.5% in a 0.05 mol/L aqueous gallium solution prepared in the same manner as in Example 10 to prepare a raw material solution and this raw material solution was used.

Example 14

A film was formed in the same manner as in Example 1 except that lead (II) chloride was added to be 1.6% in a 0.05 mol/L aqueous gallium solution prepared in the same manner as in Example 10 to prepare a raw material solution and this raw material solution was used.

Example 15

A film was formed in the same manner as in Example 1 except that antimony (V) chloride was added to be 1.5% in a 0.05 mol/L aqueous gallium solution prepared in the same manner as in Example 10 to prepare a raw material solution and this raw material solution was used.

Example 16

A film was formed in the same manner as in Example 1 except that an aluminum (III) acetylacetylacetonate complex was added to be 0.2% in a 0.05 mol/L aqueous gallium solution prepared in the same manner as in Example 10 to prepare a raw material solution and this raw material solution was used.

Example 17

A film was formed in the same manner as in Example 1 except that sodium chloride was added to be 1.5% in a 0.05 mol/L aqueous gallium solution prepared in the same manner as in Example 10 to prepare a raw material solution and this raw material solution was used.

Example 18

A film was formed in the same manner as in Example 1 except that potassium chloride was added to be 1.2% in a 0.05 mol/L aqueous gallium solution prepared in the same manner as in Example 10 to prepare a raw material solution and this raw material solution was used.

Example 19

A film was formed in the same manner as in Example 1 except that copper (II) chloride was added to be 0.5% in a 0.05 mol/L aqueous gallium solution prepared in the same manner as in Example 10 to prepare a raw material solution and this raw material solution was used.

Example 20

A film was formed in the same manner as in Example 1 except that gallium iodide (purity of 99.9%) was dissolved in water to prepare a 0.05 mol/L aqueous gallium solution and this raw material solution was used.

Example 21

A film was formed in the same manner as in Example 1 except that gallium iodide (purity of 99.99%) was dissolved in water to prepare a 0.05 mol/L aqueous gallium solution and this raw material solution was used.

Example 22

A film was formed in the same manner as in Example 1 except that gallium iodide (purity of 99.999%) was dissolved in water to prepare a 0.05 mol/L aqueous gallium solution and this raw material solution was used.

Example 23

A film was formed in the same manner as in Example 1 except that gallium bromide (purity of 99.999%) was dissolved in water to prepare a 0.05 mol/L aqueous gallium solution and this raw material solution was used.

Example 24

A film was formed in the same manner as in Example 1 except that a gallium acetylacetonate complex (purity of 99.99%) was dissolved in 1 vol % hydrochloric acid to prepare a 0.05 mol/L aqueous gallium solution and this raw material solution was used.

Comparative Example 3

A film was formed in the same manner as in Example 1 except that gallium iodide (purity of 99%) was dissolved in water to prepare a 0.05 mol/L aqueous gallium solution and this raw material solution was used.

Test Example 1

Concentrations of metal impurity in the raw material solution prepared in each of Examples and Comparative Examples were measured by ICP-MS. Table 1 shows the impurity concentrations in each of Examples 1 to 19 and Comparative Examples 1 and 2.

On Examples 20 to 23 and Comparative Example 3, concentrations of metal impurity in the solid sample (gallium compound) were further measured by GDMS to determine the purity of the gallium compound.

Table 2 shows the impurity concentrations and the purity of the gallium compound of each of Examples 20 to 24 and Comparative Example 3. The impurity concentrations by GDMS were calculated as a ratio between an amount of substance of the detected metal impurity elements and an amount of substance of gallium, and the purity was determined based on the ratio.

Test Example 2

Of the thin film of gallium oxide ($\alpha$-$Ga_2O_3$) having a corundum structure formed in each of Examples and Comparative Examples, the full width at half maximum in a rocking-curve was measured at a $\theta/\omega$ scan peak position near 40.3°. Table 1 and Table 2 show the full width at half maximum in each of Examples and Comparative Examples. A thin film having a smaller full width at half maximum has better crystallinity.

Test Example 3

Of the thin film of gallium oxide ($\alpha$-$Ga_2O_3$) having a corundum structure formed in each of Examples and Comparative Examples, film thicknesses were measured by using a step profiler at seventeen measurement positions in the surface of the substrate 110 to calculate an average film thickness from each value. Table 1 and Table 2 show the average film thickness of each of Examples and Comparative Examples. Since the film formation was performed for the same time in Examples and Comparative Examples, a thin film having a larger film thickness is formed at a higher film-forming rate.

TABLE 1

| | Raw material solution | Added metal impurity | Concentration of added metal impurity [%] | Test Example 1 concentration of metal impurity [%] | Test Example 2 full width at half maximum [arcsec] | Test Example 3 average film thickness [µm] |
|---|---|---|---|---|---|---|
| Example 1 | Metal Ga + HI | — | — | 0.004 | 24 | 1012 |
| Comparative Example 1 | $GaI_3$ | — | — | 2.2 | 645 | 682 |

TABLE 1-continued

| | Raw material solution | Added metal impurity | Concentration of added metal impurity [%] | Test Example 1 concentration of metal impurity [%] | Test Example 2 full width at half maximum [arcsec] | Test Example 3 average film thickness [μm] |
|---|---|---|---|---|---|---|
| Comparative Example 2 | $GaBr_3$ | — | — | 2.0 | 678 | 551 |
| Example 2 | Metal Ga + HI | Mg | 0.5 | 0.5 | 104 | 964 |
| Example 3 | Metal Ga + HI | Mg | 0.05 | 0.04 | 52 | 1168 |
| Example 4 | Metal Ga + HI | Co + Cr | 0.8 + 0.8 | 0.7 + 0.8 | 251 | 1048 |
| Example 5 | Metal Ga + HI | Fe | 1.5 | 1.5 | 384 | 965 |
| Example 6 | Metal Ga + HI | Mn + Ni | 0.4 + 0.4 | 0.4 + 0.3 | 152 | 945 |
| Example 7 | Metal Ga + HI | Ti | 0.1 | 0.1 | 76 | 1042 |
| Example 8 | Metal Ga + HBr | V | 0.2 | 0.2 | 85 | 1096 |
| Example 9 | Metal Ga + HBr | Zr | 0.1 | 0.1 | 69 | 984 |
| Example 10 | Metal Ga + HBr | Ba + Ca + Sr | 0.5 + 0.5 + 0.5 | 0.5 + 0.5 + 0.4 | 301 | 765 |
| Example 11 | Metal Ga + HBr | Cd | 0.5 | 0.5 | 258 | 741 |
| Example 12 | Metal Ga + HBr | Zn | 0.8 | 0.9 | 208 | 824 |
| Example 13 | Metal Ga + HBr | In | 0.5 | 0.5 | 90 | 982 |
| Example 14 | Metal Ga + HBr | Pb | 1.6 | 1.7 | 124 | 869 |
| Example 15 | Metal Ga + HBr | Sb | 1.5 | 1.5 | 194 | 1047 |
| Example 16 | Metal Ga + HBr | Al | 0.2 | 0.2 | 66 | 945 |
| Example 17 | Metal Ga + HBr | Na | 1.5 | 1.7 | 171 | 941 |
| Example 18 | Metal Ga + HBr | K | 1.2 | 1.4 | 214 | 968 |
| Example 19 | Metal Ga + HBr | Cu | 0.5 | 0.5 | 82 | 1047 |

TABLE 2

| | Ga raw material (Ga compound) | Purity of Ga compound [%] | Test Example 1 concentration of metal impurity [%] | Test Example 2 full width at half maximum [arcsec] | Test Example 3 average film thickness [μm] |
|---|---|---|---|---|---|
| Example 20 | $GaI_3$ | 99.9 | 0.096 | 42 | 1165 |
| Example 21 | $GaI_3$ | 99.99 | 0.008 | 14 | 1207 |
| Example 22 | $GaI_3$ | 99.999 | <0.001 | 7 | 1234 |
| Example 23 | $GaBr_3$ | 99.999 | <0.001 | 9 | 1158 |
| Example 24 | $Ga(acac)_3$ | 99.99 | 0.007 | 37 | 1097 |
| Comparative Example 3 | $GaI_3$ | 99 | 0.94 | 314 | 745 |

From the comparison between Example 1 and Comparative Examples 1 and 2, it is found that Example 1 can form the film having better crystallinity at a higher rate than the film formed in Comparative Examples 1 and 2. In Example 1, metal gallium is dissolved in the acidic solution containing at least one of hydrobromic acid and hydroiodic acid to prepare the raw material solution having a concentration of the metal impurity of less than 2%; and this raw material solution is used to form the film. In Comparative Examples 1 and 2, the raw material solution prepared by dissolving low-purity gallium iodide or gallium bromide in water is used.

From the comparison between Examples 20 to 24 and Comparative Examples 1 to 3, it is found that Examples 20 to 24 can form the film having better crystallinity at a higher rate than the film formed in Comparative Examples 1 to 3. In Examples 20 to 24, the gallium compound with a purity of 99.9% or more is dissolved in the solvent containing at least water to prepare the raw material solution; and this raw material solution is used to form the film. In Comparative Examples 1 to 3, the raw material solution prepared by using the gallium compound with purity of less than 99.9% is used.

It should be noted that the present invention is not limited to the above-described embodiments. The embodiments are just examples, and any examples that substantially have the same feature and demonstrate the same functions and effects as those in the technical concept disclosed in claims of the present invention are included in the technical scope of the present invention.

The invention claimed is:

1. A film-forming method in which film-formation is performed by heat-treating a mist of a raw material solution, the method comprising:

dissolving metal gallium in an acidic solution containing at least one of hydrobromic acid and hydroiodic acid to prepare an aqueous gallium solution;

adding a metal impurity to the aqueous gallium solution to prepare the raw material solution having a concentration of the metal impurity of less than 2%; and atomizing the raw material solution into a mist, and performing film-forming.

2. The film-forming method according to claim 1, wherein the raw material solution contains, as the metal impurity, at least one metal element selected from the group consisting of aluminum, cobalt, chromium, copper, iron, manganese, nickel, titanium, vanadium, zirconium, magnesium, zinc, indium, lead, barium, cadmium, strontium, calcium, antimony, sodium, and potassium.

3. The film-forming method according to claim 1, wherein the raw material solution having a concentration of the metal impurity of less than 0.5% is used.

4. The film-forming method according to claim 2, wherein the raw material solution having a concentration of the metal impurity of less than 0.5% is used.

5. The film-forming method according to claim 2, wherein used as the raw material solution is the raw material solution having a magnesium concentration of 0.5% or less, a cobalt concentration of 0.5% or less, a chromium concentration of 0.5% or less, an iron concentration of 1.5% or less, a manganese concentration of 0.4% or less, a nickel concentration of 0.3% or less, a titanium concentration of 0.1% or less, a vanadium concentration of 0.2% or less, a zirconium concentration of 0.1% or less, a barium concentration of 0.5% or less, a calcium concentration of 0.5% or less, a strontium concentration of 0.5% or less, a zinc concentration of 0.9% or less, an indium concentration of 0.5% or less, a lead concentration of 1.7% or less, an antimony concentration of 1.5% or less, an aluminum concentration of 0.2% or less, a sodium concentration of 1.7% or less, a potassium concentration of 1.4% or less, a copper concentration of 0.5% or less, a cadmium concentration of 0.5% or less, and a total concentration of the metal impurity of less than 2%.

* * * * *